United States Patent
Hafizi et al.

(10) Patent No.: US 9,264,263 B2
(45) Date of Patent: Feb. 16, 2016

(54) SERDES VOLTAGE-MODE DRIVER WITH SKEW CORRECTION

(71) Applicant: QUALCOMM Incorporated, San Diego, CA (US)

(72) Inventors: Madjid Hafizi, San Diego, CA (US); Xiaohua Kong, San Diego, CA (US); Zhi Zhu, San Diego, CA (US); Miao Li, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 14/257,848

(22) Filed: Apr. 21, 2014

(65) Prior Publication Data
US 2015/0304134 A1 Oct. 22, 2015

(51) Int. Cl.
| H04B 3/00 | (2006.01) |
|---|---|
| H04L 25/02 | (2006.01) |
| H04L 7/00 | (2006.01) |
| H03K 5/12 | (2006.01) |
| H03K 19/0185 | (2006.01) |

(52) U.S. Cl.
CPC .............. *H04L 25/0276* (2013.01); *H03K 5/12* (2013.01); *H03K 19/018528* (2013.01); *H04L 7/0091* (2013.01)

(58) Field of Classification Search
CPC .... H04B 3/00; H04B 5/0075; H04L 25/0272; H04L 25/0266; H04L 25/0274; H04L 25/0278; H04L 25/0276
USPC .................................................. 375/257–259
See application file for complete search history.

(56) References Cited

U.S. PATENT DOCUMENTS

| 6,265,833 | B1 * | 7/2001 | Kim et al. ................... 315/169.3 |
|---|---|---|---|
| 6,445,241 | B2 * | 9/2002 | Gabara ......................... 327/404 |
| 6,665,347 | B2 * | 12/2003 | van Bavel et al. ............ 375/257 |
| 6,735,030 | B2 * | 5/2004 | Ngo et al. ...................... 360/46 |
| 6,812,733 | B1 * | 11/2004 | Plasterer et al. ................ 326/30 |
| 6,847,232 | B2 * | 1/2005 | Tinsley et al. .................. 326/84 |
| 7,010,637 | B2 * | 3/2006 | To et al. ........................ 710/305 |

(Continued)

FOREIGN PATENT DOCUMENTS

DE 102013109363 A1 3/2014

OTHER PUBLICATIONS

International Search Report and Written Opinion—PCT/US2015/019915—ISA/EPO—Aug. 6, 2015.

(Continued)

*Primary Examiner* — Emmanuel Bayard
(74) *Attorney, Agent, or Firm* — Procopio, Cory, Hargreaves & Savitch LLP

(57) ABSTRACT

A driver circuit for transmitting serial data on a communication link combines voltage-mode and current-mode drivers. The driver circuit uses a voltage-mode driver as the main output driver. One or more auxiliary current-mode drivers are connected in parallel with the voltage-mode driver to adjust the output signal by injecting currents into the outputs. The voltage-mode driver supplies most of the output drive. Thus, the output driver circuit can provide the power efficiency benefits associated with voltage-mode drivers. The current-mode drivers can provide, for example, pre-emphasis, level adjustment, skew compensation, and other modifications of the output signals. Thus, the driver circuit can also provide the signal adjustment abilities associated with current-mode drivers.

27 Claims, 3 Drawing Sheets

(56) References Cited

U.S. PATENT DOCUMENTS

| | | | |
|---|---|---|---|
| 7,072,135 B2* | 7/2006 | Suzuki | 360/75 |
| 7,149,845 B2* | 12/2006 | Chan et al. | 711/108 |
| 7,212,044 B2* | 5/2007 | Huang et a | 327/108 |
| 7,215,156 B1* | 5/2007 | Li | 326/115 |
| 7,279,937 B2* | 10/2007 | Aliahmad et al. | 326/115 |
| 7,483,688 B2* | 1/2009 | Huang et al. | 455/402 |
| 7,501,851 B2* | 3/2009 | Venditti et al. | 326/30 |
| 7,639,954 B2* | 12/2009 | Lam et al. | 398/198 |
| 7,643,563 B2* | 1/2010 | Huang et al. | 375/257 |
| 7,711,939 B2* | 5/2010 | Canagasaby et al. | 713/1 |
| 7,817,727 B2* | 10/2010 | Kumar et al. | 375/258 |
| 7,893,746 B1 | 2/2011 | Zheng et al. | 327/263 |
| 8,138,802 B2* | 3/2012 | McLeod | 327/58 |
| 8,149,024 B2* | 4/2012 | Liu et al. | 327/108 |
| 8,183,885 B2* | 5/2012 | Aziz et al. | 326/86 |
| 8,415,986 B2 | 4/2013 | Seth et al. | |
| 8,416,005 B2* | 4/2013 | Luo et al. | 327/333 |
| 8,446,184 B2* | 5/2013 | Van Der Goes et al. | 327/108 |
| 8,471,189 B2* | 6/2013 | Van Der Spiegel et al. | 250/208.1 |
| 8,497,707 B2 | 7/2013 | Liu et al. | |
| 8,508,261 B2* | 8/2013 | Li | 327/108 |
| 8,558,596 B2* | 10/2013 | Kim et al. | 327/231 |
| 8,564,326 B2* | 10/2013 | Liu et al. | 326/29 |
| 8,564,352 B2* | 10/2013 | Agrawal et al. | 327/237 |
| 8,587,339 B2* | 11/2013 | Johnson | 326/82 |
| 8,604,829 B2* | 12/2013 | Liu et al. | 326/82 |
| 8,638,125 B2* | 1/2014 | Abugharbieh et al. | 327/65 |
| 8,760,189 B2* | 6/2014 | Zhong | H04L 25/0278 326/30 |
| 8,836,381 B2* | 9/2014 | Boecker et al. | 327/108 |
| 8,841,936 B2* | 9/2014 | Nakamura | 326/82 |
| 8,847,628 B1* | 9/2014 | Yan et al. | 326/115 |
| 8,928,365 B2* | 1/2015 | Li et al. | 327/112 |
| 8,994,399 B2* | 3/2015 | Ali | 326/30 |
| 9,024,665 B2* | 5/2015 | Conrow et al. | 327/108 |
| 2003/0085737 A1* | 5/2003 | Tinsley et al. | 326/86 |
| 2004/0246613 A1 | 12/2004 | Tseng | |
| 2007/0018624 A1* | 1/2007 | Guo | 323/282 |
| 2007/0257733 A1* | 11/2007 | Laletin | 330/69 |
| 2008/0106297 A1* | 5/2008 | Jao | 326/27 |
| 2009/0153219 A1* | 6/2009 | Wu et al. | 327/333 |
| 2013/0002301 A1* | 1/2013 | Gondi et al. | 326/83 |
| 2013/0057319 A1* | 3/2013 | Liu et al. | 327/108 |
| 2013/0082744 A1 | 4/2013 | Zhong et al. | |
| 2013/0106450 A1* | 5/2013 | Watanabe et al. | 324/750.01 |
| 2013/0335117 A1* | 12/2013 | Li | 326/82 |
| 2013/0342242 A1* | 12/2013 | Hsieh | 327/108 |
| 2014/0055163 A1* | 2/2014 | Song | 326/63 |
| 2014/0077836 A1* | 3/2014 | Liu et al. | 326/29 |
| 2015/0022243 A1* | 1/2015 | Wu et al. | 327/108 |
| 2015/0084800 A1* | 3/2015 | Zhang et al. | 341/155 |

OTHER PUBLICATIONS

Partial International Search Report—PCT/US20151019915—ISA/EPO—Jun. 1, 2015.

* cited by examiner

SERDES VOLTAGE-MODE DRIVER WITH SKEW CORRECTION

BACKGROUND

1. Field

The present invention relates to electronic circuits and, more particularly, to electronic circuits for driving serial data signals on a communication link.

2. Background

The use of high-speed serial communication links in electronic systems has continued to grow. High-speed serial communication links can operate according to various standards such as Universal Serial Bus (USB), High-Definition Multimedia Interface (HDMI), Serial Advanced Technology Attachment (SATA), and Peripheral Component Interconnect Express (PCIe) interfaces. A serializer/deserializer (SERDES) is used to transmit and receive from a serial communication link.

The output driver for a serial communication link typically produces a pair of differential signals that switch at high speed (e.g., 3 GHz). The output drivers may be voltage-mode drivers or current-mode drivers. Voltage-mode drivers may operate at lower power than current-mode drivers. However, providing skew correction, amplitude adjustment, pre-emphasis, and other adjustments of the output signals may be difficult in a voltage-mode driver. Additionally, achieving a large output voltage swing may be increasingly difficult as the supply voltages are reduced in advanced process technology nodes.

SUMMARY

In one aspect, a driver circuit is provided for driving data values on a differential output including a positive output node and a negative output node. The driver circuit includes a voltage-mode driver module configured to drive voltages on the positive output node and the negative output node based on values on an input of the voltage-mode driver module; and a first current-mode driver module including: a head current source operable to source a first current; a tail current source operable to sink a second current; and switches configured to selectively couple the head current source and the tail current source to the positive output node and the negative output node based on values on an input of the first current-mode driver module, wherein the magnitudes of the first current and the second current independently selectable.

In one aspect, a method for driving a serial data signal on a communication link is provided. The method includes: driving the communication link using a voltage-mode driver module having differential outputs coupled to a positive output node and a negative output node, wherein the voltage-mode driver module is configured to drive voltages on the outputs based on values on an input of the voltage-mode driver module; driving the communication link using a current-mode driver module having outputs coupled to the positive output node and the negative output node, wherein the current-mode driver is operable to selectively couple a head current source and a tail current source to the positive output node and the negative output node; and selecting currents of the head current source and the tail current source based at least in part on correcting skew on the positive output node and the negative output node.

In one aspect, a driver circuit is provided that includes: means for driving voltages on a differential output including a positive output node and a negative output node, wherein the driven voltages are based on values on an input of the means for driving voltages circuit; and means for driving currents on the differential output, including: a head current source operable to source a first current; a tail current source operable to sink a second current; and switches configured to selectively couple the head current source and the tail current source to the positive output node and the negative output node based on values on an input of the means for driving currents, wherein the magnitudes of the first current and the second current are independently selectable.

Other features and advantages of the present invention should be apparent from the following description which illustrates, by way of example, aspects of the invention.

BRIEF DESCRIPTION OF THE DRAWINGS

The details of the present invention, both as to its structure and operation, may be gleaned in part by study of the accompanying drawings, in which like reference numerals refer to like parts, and in which.

DETAILED DESCRIPTION

The detailed description set forth below, in connection with the accompanying drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in simplified form in order to avoid obscuring such concepts.

Figure 1:
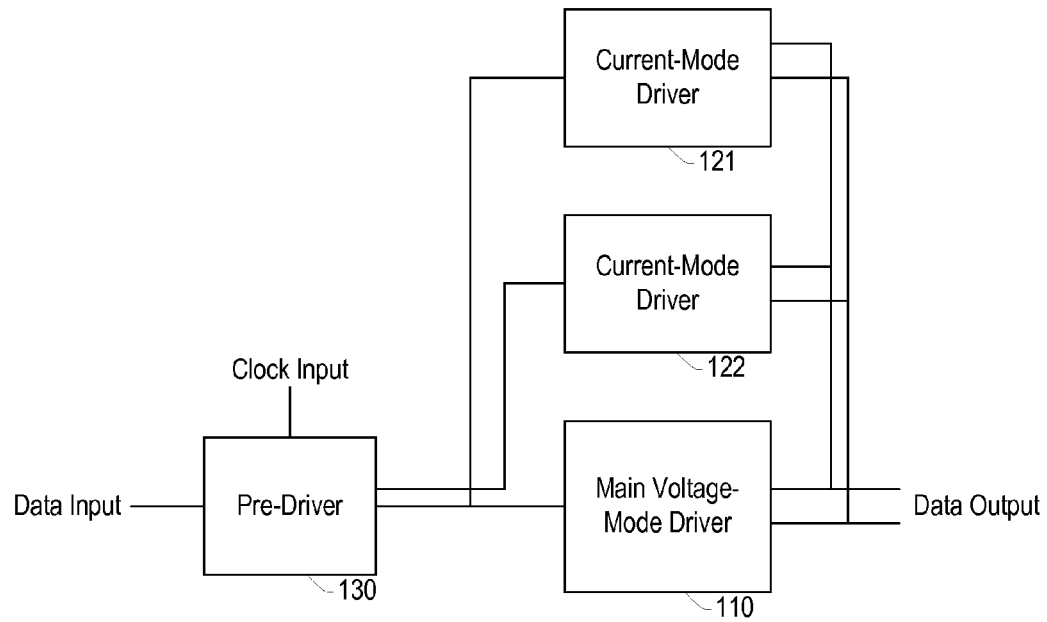
FIG. 1 is a functional block diagram of a driver circuit according to a presently disclosed embodiment.

FIG. 1 is a functional block diagram of a driver circuit according to a presently disclosed embodiment. The driver circuit receives a data input signal that contains values to be driven on a communication link. The driver circuit also receives, in many embodiments, a clock input signal that signals the timing of the data input. The clock input signal may oscillate at a frequency that matches the data rate of the data input signal or may oscillate at a harmonic or sub-harmonic of the data rate. The driver circuit may be, for example, implemented in a CMOS integrated circuit.

The driver circuit drives the data output signal based on the values on the data input signal. In the embodiment of FIG. 1, the data output signal is a differential signal on a positive output node and a negative output node. In other embodiments, the data output signal may be single ended. The characteristics (e.g., signal levels and timing) of the data output signal are often based on a communication standard, for example, USB or HDMI. The communication link that is driven by the driver circuit will have a characteristic impedance and the output impedance of the driver circuit may be designed to approximately match (e.g., with a 20% tolerance) the characteristic impedance of the communication link.

The driver circuit includes a pre-driver module 130 that receives the data input signal that signals the data to be output by the driver circuit. The pre-driver module 130 supplies signals to a voltage-mode driver module 110, a first current-mode driver module 121, and a second current-mode driver module 122. The voltage-mode driver module 110 supplies most of the output drive and may be termed a main driver module. The current-mode driver modules 121, 122 may be termed auxiliary driver modules. In various implementations, the driver circuit can include different numbers of current-mode driver modules depending, for example, on the functions provided by the driver circuit.

The signals supplied by the pre-driver module 130 to the voltage-mode driver module 110, the first current-mode driver module 121, and the second current-mode driver module 122 can be modified versions of the data input signal. For example, when the second current-mode driver module 122 is used to provide pre-emphasis, the signal it receives may be a delayed (by one unit interval) and inverted copy of the data input signal. The pre-driver module 130 may use a string of flip-flops clocked by the clock input signal to produce delayed copies of the data input signal. In the embodiment illustrated in FIG. 1, the input to the voltage-mode driver module 110 and the input to the first current-mode driver module 121 are coupled together and the pre-driver module 130 supplies the signal to both modules. In other embodiments, the pre-driver module 130 supplies different signals to the voltage-mode driver module 110 and the first current-mode driver module 121.

The outputs of the main voltage-mode driver module 110, the first current-mode driver module 121, and the second current-mode driver module 122 are connected in parallel. The voltage-mode driver module 110 may provide a controlled output impedance (e.g., 100 ohms) to match the transmission line to be driven. The controlled output impedance of the voltage-mode driver module 110 may be achieved through calibration. The first current-mode driver module 121 and the second current-mode driver module 122 have high output impedances (e.g., 10 k ohms). Thus, when the driver modules are connected in parallel, the combined output impedance is essentially the same as the output impedance of the voltage-mode driver module 110. Additionally, the high output impedance of the current-mode driver modules does not greatly perturb the symmetry of the output signal and keeps the output common-mode voltage intact.

The current-mode driver modules can provide various functions. In the embodiment of FIG. 1, the first current-mode driver module can provide both skew and swing correction and the second current-mode driver module 122 can provide pre-emphasis. The current-mode driver modules may be viewed as injecting a current into the output of the driver circuit. The polarity of the injected current, whether the current is injected into the positive output or the negative output, is based on the data input received by the current-mode driver module. The magnitude of the injected current is also controlled. Additionally, the magnitude of the injected current may differ when the current is sourced to the output node or sunk from the output node.

The first current-mode driver module 121 can correct skew between the positive and negative signal components of the differential output by injecting a different amount of current depending upon whether the current is sourced or sunk to the output node. For example, to correct a skew of 1 ps between the positive output node and the negative output node, 50 μA current offset between the sourced and sunk currents may be applied.

The first current-mode driver module 121 can change the output swing (signal levels) by injecting additional current into the differential output. The additional current may be determined based on the additional voltage swing to be provided and the impedance on the output. For example, to add 50 mV to the output levels of a 100 ohm output, 500 μA of current may be injected.

The second current-mode driver module 122 can provide pre-emphasis on the output signal of the driver circuit. It is used when the swing on the output is larger (emphasized) for the first bit after a change in data values. For example, the first ONE output after a ZERO output may have a level of 1.2 V and subsequent consecutive ONE outputs may have a level of 0.8 V. To provide this pre-emphasis, the second current-mode driver module 122 receives a delayed data input signal used by the voltage-mode driver module 110 and the magnitude and polarities of the current injected are determined based on the amount of pre-emphasis.

Figure 2:
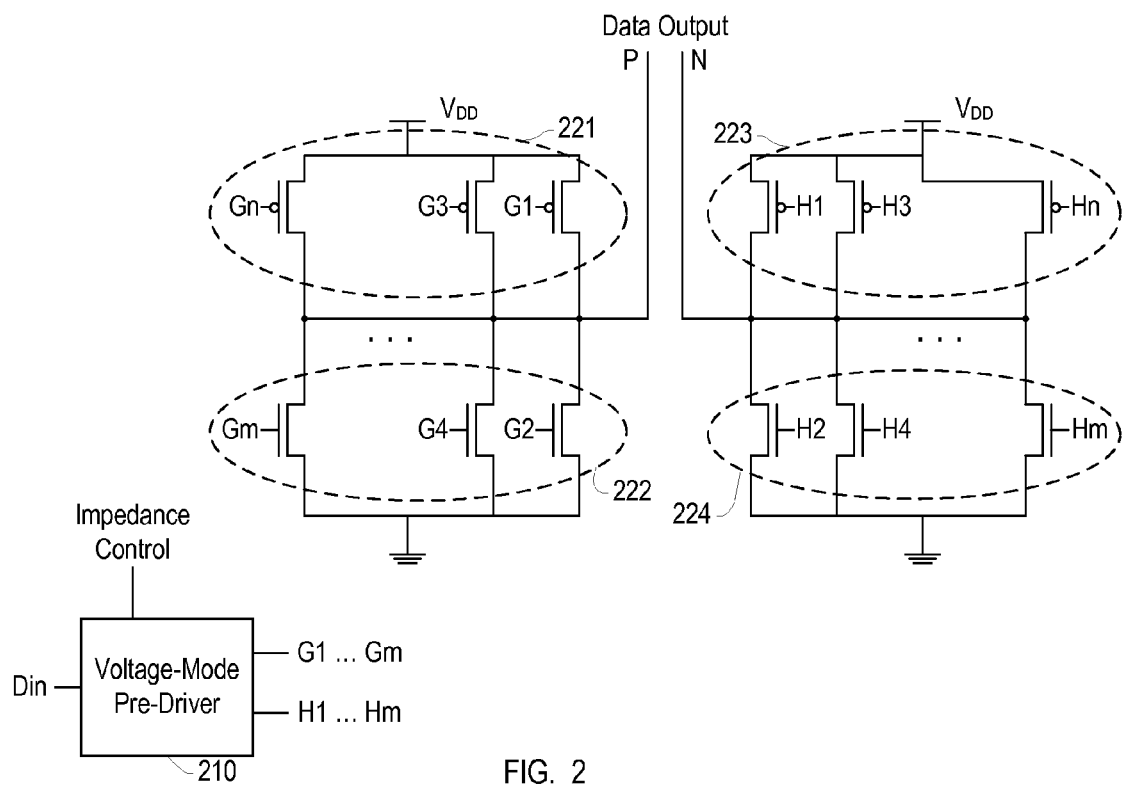
FIG. 2 is a schematic diagram of a voltage-mode driver module according to a presently disclosed embodiment.

FIG. 2 is a schematic diagram of a voltage-mode driver module according to a presently disclosed embodiment. The voltage-mode driver module of FIG. 2 may be used to implement the voltage-mode driver module 110 of the driver circuit of FIG. 1. Other voltage-mode driver modules may also be used in the driver circuit of FIG. 1.

The voltage-mode driver module of FIG. 2 includes a first plurality of p-channel transistors 221 and a first plurality of n-channel transistors 222 that drive the positive output node (Data Output P) and a second plurality of p-channel transistors 223 and a second plurality of n-channel transistors 224 that drive the negative output node (Data Output N). The individual transistors in the pluralities of transistors may be referred to as transistor legs. Each plurality of transistors may include, for example, 70 transistor legs.

The transistor legs in the first plurality of p-channel transistors 221 have their sources connected to a voltage supply ($V_{DD}$) and their drains connected to the positive output node. The transistor legs in the second plurality of p-channel transistors 223 have their sources connected to a voltage supply ($V_{DD}$) and their drains connected to the negative output node. The transistor legs in the first plurality of n-channel transistors 222 have their sources connected to a ground reference and their drains connected to the positive output node. The transistor legs in the second plurality of n-channel transistors 224 have their sources connected to a ground reference and their drains connected to the negative output node. The gates of the transistor legs are controlled by signals from a voltage-mode pre-driver module 210.

The voltage-mode pre-driver module 210 receives a data input signal and an impedance control signal. The voltage-mode pre-driver module 210 produces control signals to drive the gates of the first and second pluralities of p-channel transistors and n-channel transistors based in part on the value of the data input signal. For example, when the data input signal is a ONE, the control signals (G1, G3, . . . Gn) for the first plurality of p-channel transistors 221 turn on one or more of the transistor legs to drive the positive output toward the voltage supply and the control signals (H2, H4, . . . Hm) for the second plurality of n-channel transistors 224 turn on one or more of the transistor legs to drive the negative output toward the ground reference resulting in a positive voltage on the differential output. Similarly, when the data input signal is a ZERO, the control signals (H1, H3, . . . Hn) for the second plurality of p-channel transistors 223 turn on one or more of the transistor legs to drive the negative output toward the voltage supply and the control signals (G2, G4, . . . Gm) for the first plurality of n-channel transistors 222 turn on one or more of the transistor legs to drive the positive output toward the ground reference resulting in a negative voltage on the differential output.

The impedance control signal signals how many of the transistor legs should be used in parallel to provide the desired output impedance of the driver circuit. The impedance control signal may be determined by a calibration process. For example, the calibration process may determine that 40 transistor legs should be used in parallel to provide the desired output impedance. Additionally, transistor legs in the first plurality of p-channel transistors 221 and transistor legs in the first plurality of n-channel transistors 222 may be turned on at the same time to control the output swing by acting as a resistive voltage divider. For example, enabling 38 transistor legs in the first plurality of p-channel transistors 221 and two transistor legs in the first plurality of n-channel transistors 222 can provide an output level that is about 5% less than the maximum allowed by the level of the voltage supply. The control signals (H1-Hm) for the gates of the second plurality of p-channel transistors 223 and the second plurality of n-channel transistors 224 may be complementary to the control signals (G1-Gn) for the first plurality of p-channel transistors 221 and the first plurality of n-channel transistors 222.

Figure 3:
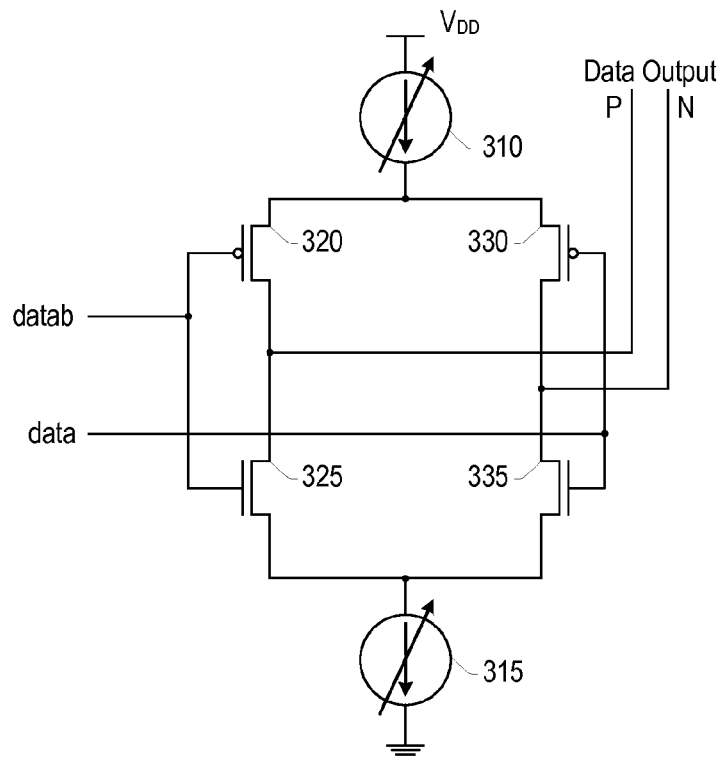
FIG. 3 is a schematic diagram of a current-mode driver module according to a presently disclosed embodiment.

FIG. 3 is a schematic diagram of a current-mode driver module according to a presently disclosed embodiment. The current-mode driver module of FIG. 2 may be used to implement the current-mode driver modules 121, 122 of the driver circuit of FIG. 1. Other current-mode driver modules may also be used in the driver circuit of FIG. 1. The current-mode driver module may be viewed as a transconductor that converts a differential input voltage to a differential output current.

The current-mode driver module of FIG. 3 includes a head current source 310 and a tail current source 315. The head current source 310 sources a current from a voltage supply ($V_{DD}$). The tail current source 315 sinks a current to a ground reference.

The current-mode driver module switches between supplying current from the head current source 310 to the positive output node (Data Output P) and sinking current from the negative output node (Data Output N) to the tail current source 315 and supplying current from the head current source 310 to the negative output node and sinking current from the positive output node to the tail current source 315. The switching is based on the data input to the current-mode driver module. When the data input is ONE, current is sourced to the positive output node and sunk from the negative output node; when the data input is ZERO, current is sourced to the negative output node and sunk from the positive output node. In the embodiment of FIG. 3, the data input is a complementary signal with a positive input node (data) and a negative input node (datab). The complementary inputs may be provided, for example, by the pre-driver module 130 of the driver circuit of FIG. 1.

The current-mode driver module uses switches (320, 325, 330, 335) to selectively couple the head current source 310 and the tail current source 315 to the data outputs. In the embodiment of FIG. 3, the switches are implemented with transistors. A first p-channel transistor (switch 320) has its gate connected to the negative input node, its drain connected to the positive output node, and its source connected to the head current source 310. A first n-channel transistor (switch 325) has its gate connected to the negative input node, its drain connected to the positive output node, and its source connected to the tail current source 315. A second p-channel transistor (switch 330) has its gate connected to the positive input node, its drain connected to the negative output node, and its source connected to the head current source 310. A second n-channel transistor (switch 335) has its gate connected to the positive input node, its drain connected to the negative output node, and its source connected to the tail current source 315.

The head current source 310 and the tail current source 315 are adjustable high-impedance current sources. The current sources may be, for example, current-mode digital-to-analog converters. Alternatively, the current sources may include digital-to-analog converters that control the currents of separate current sources. The magnitudes of the currents of the head current source 310 and the tail current source 315 are adjusted according to the function of the current-mode driver module. The currents of the head current source 310 and the tail current source 315 may be independently controlled. The currents of the head current source 310 and the tail current source 315 can be set to different values to compensate for output skew.

The same or similar implementations of the current-mode driver module of FIG. 3 may be used for different purposes, for example, to compensate or correct for skew, to change the output signal amplitude of a driver circuit and to provide pre-emphasis.

Figure 4:
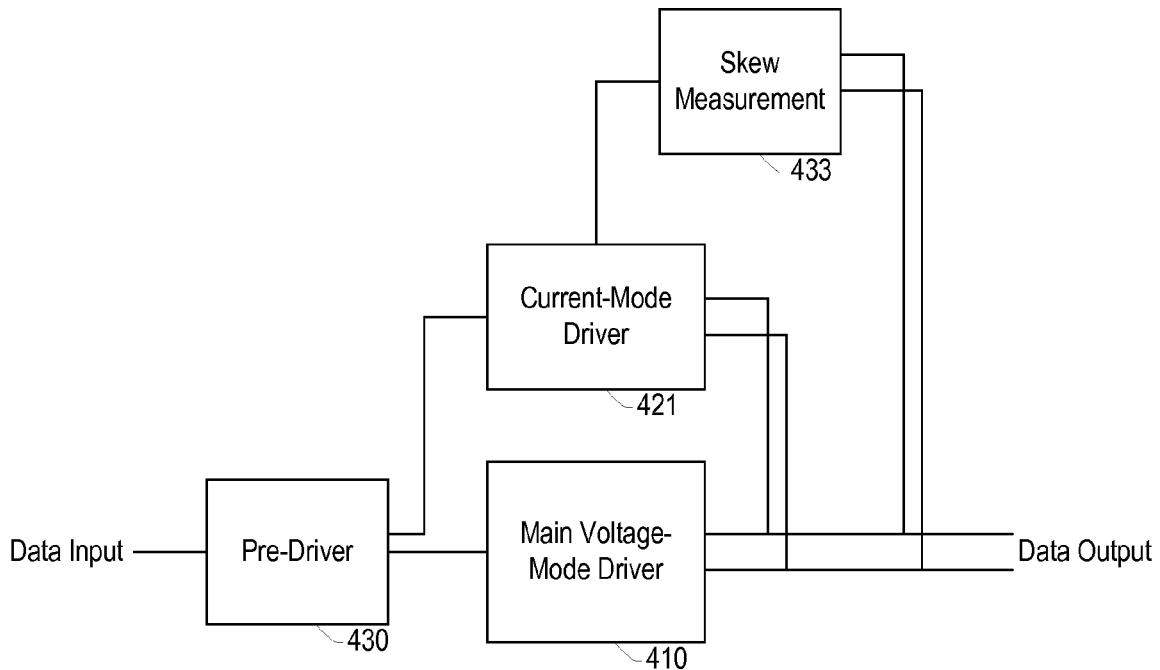
FIG. 4 is a functional block diagram of another driver circuit according to a presently disclosed embodiment.

FIG. 4 is a functional block diagram of another driver circuit according to a presently disclosed embodiment. The driver circuit of FIG. 4 is similar to the driver circuit of FIG. 1, including a pre-driver module 430, a current-mode driver module 421, and a voltage-mode driver module 410, with like referenced elements operating in like fashion except for described differences. The voltage-mode driver module of FIG. 2 and the current-mode driver module of FIG. 3 may be used in the driver circuit of FIG. 4.

The driver circuit of FIG. 4 includes a skew measurement module 433. The skew measurement module 433 receives the differential data output signal (Data Output) of the driver circuit. The skew measurement module 433 measures skew on the data output signal and evaluates the measurements to determine a correction or compensation to be performed using the current-mode driver module 421. The measurement may include sampling and comparing values on the positive output node and the negative output node at various times. When the current-mode driver module 421 is implemented using the current-mode driver module of FIG. 3, the skew correction can be performed by independently adjusting the current of the head current source 310 and the current of the tail current source 315. For example, the skew measurement module 433 may supply control signals to digital-to-analog converters to select the current of the head current source 310 and the current of the tail current source 315. The skew measurement module 433 may also be used for other measurements (e.g., amplitude) and adjustments of the data output signal.

The skew measurement module 433 may be integrated in the same integrated circuit as the other modules of the driver circuit. The skew measurement and correction may then be performed with the driver circuit operating in situ. Alternatively or additionally, the skew measurement module may be performed by test equipment, for example, test equipment used in manufacturing an integrated circuit that includes the other modules of the driver circuit. Values that indicate the currents for skew correction may then be stored for later use.

Figure 5:
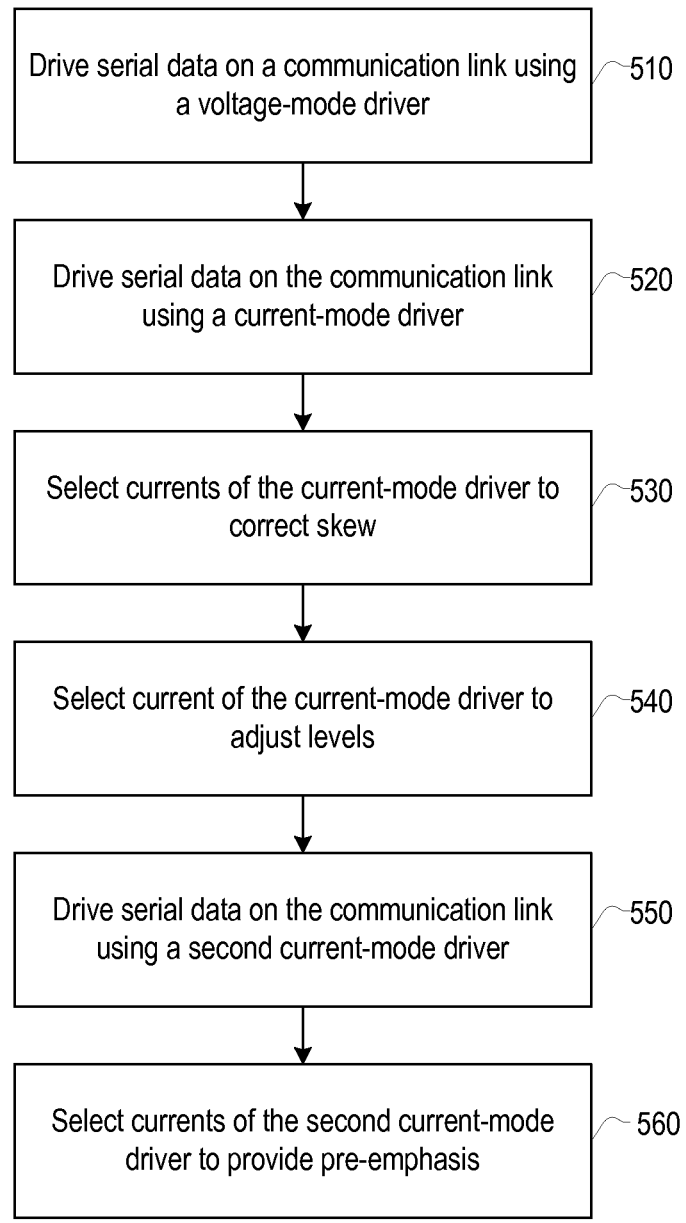
FIG. 5 is a flowchart of a process for driving a serial data signal according to a presently disclosed embodiment.

FIG. 5 is a flowchart of a process for driving a serial data signal according to a presently disclosed embodiment. The process may be performed using the driver circuits and modules described above.

In step 510, serial data is driven on a communication link using a voltage-mode driver. For example, the voltage-mode driver of FIG. 2 can be used to drive data on the communication link at a particular amplitude and with a particular output impedance. In step 520, serial data is driven on the communication link using a current-mode driver. For example, the current-mode driver of FIG. 3 can be used to drive data on the communication link with particular currents sourced to and sunk from the outputs. Step 510 and step 520 are generally performed concurrently.

In step 530, the currents sourced and sunk by the current-mode driver are selected to correct for skew on the driven data output. Selecting currents to correct for skew may include measuring skew on the driven data output and using the measured skew to select the currents. Additionally, in step 540, the currents of the current-mode driver can be further adjusted to control the output level of the driven data output. The magnitudes of the currents can be independently selected as described above with reference to the driver circuit of FIG. 1. Since the currents are selected to correct for skew and to provide level adjustment, the currents may be said to be based at least in part on each consideration.

In step 550, serial data is driven on the communication link with a second current-mode driver. The second current-mode driver module 122 of the driver circuit of FIG. 1, for example, may be used to perform step 550. Step 550 is generally performed concurrently with step 510 and step 520. In step 560, the currents sourced and sunk by the second current-mode driver in step 550 are selected cording to a desired pre-emphasis on the driven data output.

The process of FIG. 5 may be modified, for example, by adding, altering, or reordering steps.

Although embodiments of the invention are described above for particular embodiments, many variations of the invention are possible, including, for example, those with different signal polarities or with additional driver modules. Additionally the embodiments have been described for CMOS technology but similar circuits may be used with other technologies. Additionally, features of the various embodiments may be combined in combinations that differ from those described above. Although the driver circuits have been described as operating with differential signals, the same or similar circuits may be used with single-ended signals.

The above description of the disclosed embodiments is provided to enable any person skilled in the art to make or use the invention. Various modifications to these embodiments will be readily apparent to those skilled in the art, and the generic principles described herein can be applied to other embodiments without departing from the spirit or scope of the invention. Thus, it is to be understood that the description and drawings presented herein represent presently preferred embodiments of the invention and are therefore representative of the subject matter which is broadly contemplated by the present invention. It is further understood that the scope of the present invention fully encompasses other embodiments that may become obvious to those skilled in the art and that the scope of the present invention is accordingly limited by nothing other than the appended claims.

What is claimed is:

1. A driver circuit for driving data values on a differential output including a positive output node and a negative output node, the driver circuit comprising:
   a voltage-mode driver module configured to drive voltages on the positive output node and the negative output node based on values on a data input of the voltage-mode driver module; and
   a first current-mode driver module including:
      a head current source operable to source a first current;
      a tail current source operable to sink a second current; and
      switches configured to selectively couple the head current source to the negative output node and the tail current source to the positive output node or couple the head current source to the positive output node and the tail current source to the negative output node based on values on a data input of the first current-mode driver module,
   wherein the magnitudes of the first current and the second current are independently selectable.

2. The driver circuit of claim 1, wherein the magnitudes of the first current and the second current are selected based at least in part on correcting skew on the output of the driver circuit.

3. The driver circuit of claim 2, wherein the magnitudes of the first current and the second current are further selected based at least in part on adjusting an output swing of the driver circuit.

4. The driver circuit of claim 1, wherein the head current source includes a digital-to-analog converter to determine the first current, and wherein the tail current source includes a digital-to-analog converter to determine the second current.

5. The driver circuit of claim 4, further comprising a skew measurement module coupled to the output of the driver circuit and configured to measure skew on the differential output of the driver circuit and control the digital-to-analog converter of the head current source and the digital-to-analog converter of the tail current source based at least in part on the measured skew.

6. The driver circuit of claim 1, wherein the data input of the voltage-mode driver module is coupled to the data input of the first current-mode driver module.

7. The driver circuit of claim 1, wherein the data input of the first current-mode driver module includes a positive input node and a negative input node, and wherein the switches of the first current-mode driver module include:
   a first p-channel transistor having a gate coupled to the negative input node, a drain coupled to the positive output node, and a source coupled to the head current source;
   a first n-channel transistor having a gate coupled to the negative input node, a drain coupled to the positive output node, and a source coupled to the tail current source;
   a second p-channel transistor having a gate coupled to the positive input node, a drain coupled to the negative output node, and a source coupled to the head current source; and
   a second n-channel transistor having a gate coupled to the positive input node, a drain coupled to the negative output node, and a source coupled to the tail current source.

8. The driver circuit of claim 1, further comprising a second current-mode driver module including:
   a second head current source operable to source a third current;
   a second tail current source operable to sink a fourth current; and
   switches configured to selectively couple the second head current source and the second tail current source to the positive output node and the negative output node based on values on a data input of the second current-mode driver module,
   wherein the magnitudes of the third current and the fourth current are selected based at least in part on a pre-emphasis to be provided on the output of the driver circuit.

9. The driver circuit of claim 8, wherein the values on the data input of the second current-mode driver module are delayed copies of the values on the data input of the voltage-mode driver module.

10. The driver circuit of claim 1, further comprising a pre-driver module configured to supply the data input to the voltage-mode driver module and the data input to the first current-mode driver module based on an input of the driver circuit.

11. The driver circuit of claim 1, wherein the voltage-mode driver module includes a plurality of transistors having sources and drains coupled in parallel, and a voltage-mode pre-driver module configured to supply signals to drive gates of the plurality of transistors to produce a selected output impedance of the voltage-mode driver.

12. A method for driving a serial data signal on a communication link, the method comprising:
    driving the communication link using a voltage-mode driver module having differential outputs coupled to a positive output node and a negative output node, wherein the voltage-mode driver module is configured to drive voltages on the outputs based on values on a data input of the voltage-mode driver module;
    driving the communication link using a current-mode driver module having outputs coupled to the positive output node and the negative output node, wherein the current-mode driver module is operable to selectively couple a head current source and a tail current source to the positive output node and the negative output node; and
    selecting currents of the head current source and the tail current source based at least in part on correcting skew on the positive output node and the negative output node.

13. The method of claim 12, wherein the current of the head current source and the current of the tail current source differ.

14. The method of claim 12, further comprising selecting the currents of the head current source and of the tail current source based at least in part on adjusting an output swing of the positive output node and the negative output node.

15. The method of claim 12, further comprising measuring the skew on the positive output node and the negative output node, wherein selecting currents of the head current source and the tail current source based at least in part on correcting skew uses the measured skew.

16. The method of claim 12, further comprising:
    driving the communication link using a second current-mode driver module having outputs coupled to the positive output node and the negative output node, wherein the second current-mode driver module is operable to selectively couple a second head current source and a second tail current source to the positive output node and the negative output node; and
    selecting currents of the second head current source and the second tail current source based at least in part on a pre-emphasis to be provided on the positive output node and the negative output node.

17. A driver circuit, comprising:
    means for driving voltages on a differential output including a positive output node and a negative output node, wherein the driven voltages are based on values on a data input of the means for driving voltages circuit; and
    means for driving currents on the differential output, including:
        a head current source operable to source a first current;
        a tail current source operable to sink a second current; and
        switches configured to selectively couple the head current source to the negative output node and the tail current source to the positive output node or couple the head current source to the positive output node and the tail current source to the negative output node based on values on a data input of the means for driving currents,
    wherein the magnitudes of the first current and the second current are independently selectable.

18. The driver circuit of claim 17, wherein the magnitude of the first current and the magnitude of the second current are selected based at least in part on correcting skew on the output of the driver circuit.

19. The driver circuit of claim 18, wherein the magnitudes of the first current and the second current are further selected based at least in part on adjusting an output swing of the driver circuit.

20. The driver circuit of claim 17, wherein the head current source includes a digital-to-analog converter to source the first current, and wherein the tail current source includes a digital-to-analog converter to sink the second current.

21. The driver circuit of claim 20, further comprising a means for measuring skew coupled to the output of the driver circuit and configured to measure skew on the output of the driver circuit and control the digital-to-analog converter of the head current source and the digital-to-analog converter of the tail current source based at least in part on the measured skew.

22. The driver circuit of claim 17, wherein the data input of the means for driving voltages is coupled to the data input of the means for driving currents.

23. The driver circuit of claim 17, wherein the data input of the means for driving currents includes a positive input node and a negative input node, and wherein the switches of the means for driving currents include:
    a first p-channel transistor having a gate coupled to the negative input node, a drain coupled to the positive output node, and a source coupled to the head current source;
    a first n-channel transistor having a gate coupled to the negative input node, a drain coupled to the positive output node, and a source coupled to the tail current source;
    a second p-channel transistor having a gate coupled to the positive input node, a drain coupled to the negative output node, and a source coupled to the head current source; and
    a second n-channel transistor having a gate coupled to the positive input node, a drain coupled to the negative output node, and a source coupled to the tail current source.

24. The driver circuit of claim 17, further comprising a second means for driving currents on the differential output, including:
    a second head current source operable to source a third current;
    a second tail current source operable to sink a fourth current; and
    switches configured to selectively couple the second head current source and the second tail current source to the positive output node and the negative output node based on values on a data input of the second means for driving currents,
    wherein the magnitudes of the third current and the fourth current are selected based at least in part on a pre-emphasis to be provided on the output of the driver circuit.

25. The driver circuit of claim 24, wherein the values on the data input of the second means for driving currents are delayed copies of the values on the data input of the means for driving voltages.

26. The driver circuit of claim 17, further comprising a pre-driver module configured to supply the data inputs to the means for driving voltages and the means for driving currents based on an input of the driver circuit.

27. The driver circuit of claim 17, wherein the means for driving voltages includes a plurality of transistors having sources and drains coupled in parallel, and a voltage-mode pre-driver module configured to supply signals to drive the gates of the plurality of transistors to produce a selected output impedance of the voltage-mode driver.

\* \* \* \* \*